US008525207B2

(12) United States Patent
Selverian

(10) Patent No.: US 8,525,207 B2
(45) Date of Patent: Sep. 3, 2013

(54) LED PACKAGE USING PHOSPHOR CONTAINING ELEMENTS AND LIGHT SOURCE CONTAINING SAME

(75) Inventor: John H. Selverian, North Reading, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 328 days.

(21) Appl. No.: 13/051,694

(22) Filed: Mar. 18, 2011

(65) Prior Publication Data

US 2011/0164397 A1 Jul. 7, 2011

Related U.S. Application Data

(63) Continuation-in-part of application No. 12/211,325, filed on Sep. 16, 2008, now Pat. No. 8,188,486.

(51) Int. Cl.
*H01L 33/00* (2010.01)

(52) U.S. Cl.
USPC .......................................................... 257/98

(58) Field of Classification Search
USPC ............................................................ 257/98
See application file for complete search history.

(56) References Cited

U.S. PATENT DOCUMENTS

| 6,692,136 | B2 | 2/2004 | Marshall et al. |
| 7,183,706 | B2 | 2/2007 | Ellens et al. |
| 7,344,952 | B2 | 3/2008 | Chandra |
| 7,479,662 | B2 | 1/2009 | Soules et al. |
| 7,488,088 | B2 | 2/2009 | Brukilacchio |
| 7,510,888 | B2 | 3/2009 | Guenther et al. |
| 7,618,157 | B1 | 11/2009 | Galvez et al. |
| 7,703,945 | B2 | 4/2010 | Leung et al. |
| 7,859,190 | B2 | 12/2010 | Shi |
| 7,883,226 | B2 | 2/2011 | Li |
| 2002/0063520 | A1 | 5/2002 | Yu et al. |
| 2003/0067264 | A1 | 4/2003 | Takekuma |
| 2005/0072981 | A1* | 4/2005 | Suenaga ........................ 257/88 |
| 2007/0063214 | A1 | 3/2007 | Kim et al. |
| 2009/0152582 | A1* | 6/2009 | Chang et al. ................... 257/98 |
| 2009/0184333 | A1* | 7/2009 | Wang et al. .................... 257/88 |
| 2010/0232134 | A1 | 9/2010 | Tran |
| 2010/0277932 | A1* | 11/2010 | Chen et al. .................. 362/382 |
| 2011/0031516 | A1 | 2/2011 | Basin et al. |

FOREIGN PATENT DOCUMENTS

| EP | 2117054 A2 | 11/2009 |
| WO | 200509875 A2 | 10/2005 |
| WO | 2005/104252 A1 | 3/2007 |
| WO | 2010/123059 A1 | 10/2010 |
| WO | 2010126592 A2 | 11/2010 |

OTHER PUBLICATIONS

Search Report and Written Opinion mailed May 30, 2012 for PCT app PCT/US2012/027362 filed Mar. 2, 2012.

* cited by examiner

*Primary Examiner* — Anthony Ho
(74) *Attorney, Agent, or Firm* — Robert F. Clark

(57) ABSTRACT

A light-emitting diode package is described comprising a body including a hollow having a rim that extends outwardly from an open end of the hollow. A light emitting diode is positioned in the hollow and opposite the open end. A nongaseous transparent optical medium fills the hollow and a phosphor-containing element (PCE) is disposed over the hollow sealing the open end. The PCE has a solid body and a lateral portion including a periphery and dividing a top and a bottom. The bottom of the PCE is convex and in contact with the nongaseous transparent optical medium and the periphery of the PCE is in contact with the rim.

12 Claims, 5 Drawing Sheets

LED PACKAGE USING PHOSPHOR CONTAINING ELEMENTS AND LIGHT SOURCE CONTAINING SAME

CROSS-REFERENCE TO RELATED APPLICATIONS

This application is a continuation-in-part of application Ser. No. 12/211,325, filed Sep. 16, 2008, now U.S. Pat. No. 8,188,486 the disclosure of which is hereby incorporated by reference.

TECHNICAL FIELD

This invention relates to lighting devices and more particularly to lighting devices employing light emitting diodes (LED or LEDs).

BACKGROUND OF THE INVENTION

An increasing number of lighting devices utilizing LEDs have been introduced in the recent past. Many of these devices serve as replacements for incandescent or fluorescent lamps. Since most LEDs emit light in a very narrow range (most LEDs are considered to be single color emitters) it has been necessary to combine various colors (e.g., for example, red, green and blue) to provide white light. Recent advances in LEDs have provided LEDs that emit strongly in the blue and UV range such that, when combined with phosphors that emit in the yellow region of the spectrum, provide an acceptable version of white light. Current methods of providing the phosphor component include applying a phosphor-containing silicone encapsulant; phosphor-coated or phosphor-filled plastic sheets; or phosphor-ceramic compositions. In all of these former constructions it is very difficult to control the dimensions of phosphor-containing elements. Also, since many LED devices include a hollow package, which is subsequently filled with a transparent optical medium, the occasional introduction of air bubbles at the interface between the phosphor-containing element and the optical medium presents the industry with maintenance and quality control issues.

SUMMARY OF THE INVENTION

It is, therefore, an object of the invention to obviate the above enumerated disadvantages of the prior art.

It is another object of the invention to enhance the operation of LED devices.

Yet another object of the invention is the improvement of quality control in LED devices.

These objects are accomplished, in one aspect of the invention, by the provision of a light-emitting diode package comprising a body including a hollow having a rim that extends outwardly from an open end of the hollow. A light emitting diode is positioned in the hollow and opposite the open end. A nongaseous transparent optical medium fills the hollow and a phosphor-containing element (PCE) is disposed over the hollow sealing the open end. The PCE has a solid body and a lateral portion including a periphery and dividing a top and a bottom. The bottom of the PCE is convex and in contact with the nongaseous transparent optical medium and the periphery of the PCE is in contact with the rim.

In another aspect of the invention, there is provided a light source comprising an array of light emitting diodes. Each light emitting diode is positioned in a hollow having an outwardly extending rim. A plurality of phosphor-containing elements (PCE) is provided with each PCE disposed above a respective light emitting diode. A nongaseous transparent optical medium is disposed between each PCE and its respective light emitting diode. Each PCE comprises a solid body having a lateral portion dividing a top and a bottom. The bottom of each PCE is convex and its lateral portion has a periphery that may include at least one venting aperture. The bottom of each PCE in contact with the nongaseous transparent optical medium with its periphery in contact with the rim.

In a further aspect of the invention, the light source is a color modification assembly that comprises a plurality of PCEs at least some of which contain phosphors selected from the group of red, yellow, blue and green emitting phosphors.

The invention thus provides accurate dimensional control of the PCEs and, with the proper selection of PCEs for the color modification assembly, a wide control of the color output of the device.

DETAILED DESCRIPTION OF THE INVENTION

Figure 1:
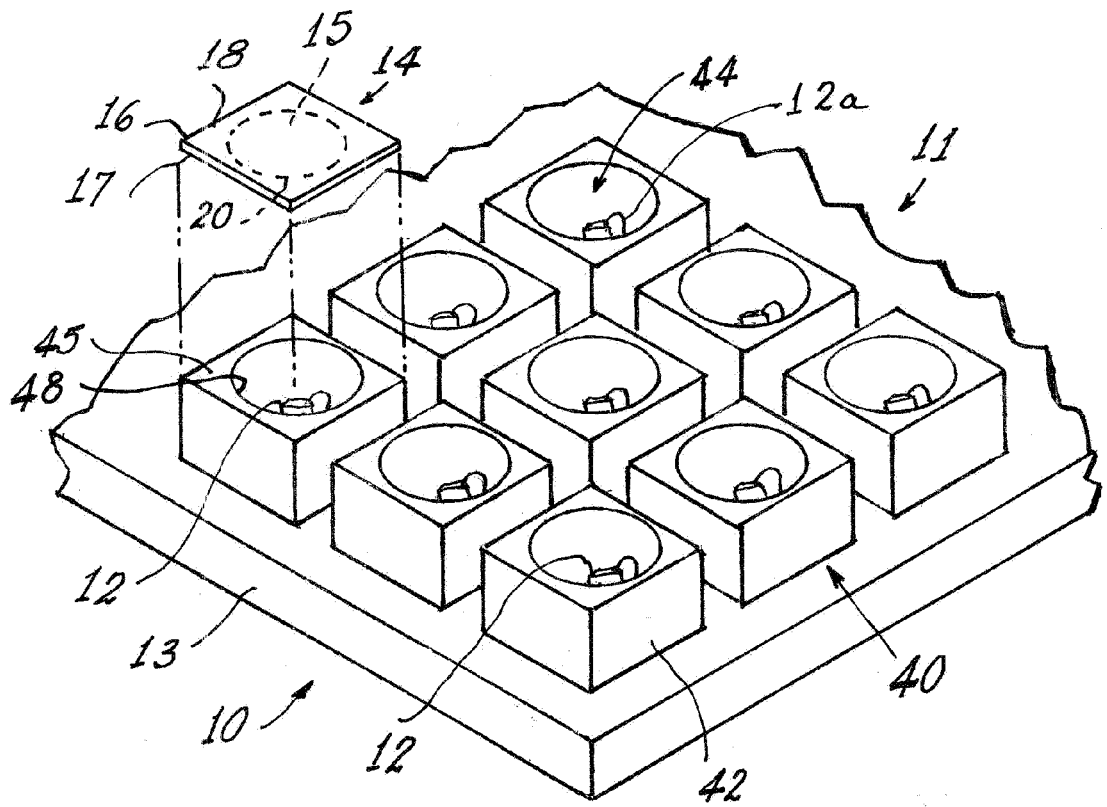
FIG. 1 is a perspective view of an embodiment of the invention.

For purposes of this application it is to be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. The term "and/or" includes any and all combinations of one or more of the associated listed items.

Although the terms "first," "second," "third" etc. may be used to describe various elements, components, regions, layers and/or sections, these elements, components, regions, layers and/or sections are not to be limited by theses terms as they are used only to distinguish one element, component, region, layer or section from another element, component, region, layer or section. Thus, a first element, component, region, layer or section could be termed a second element, component, region, layer or section without departing from the scope and teachings of the present invention.

Spatially relative terms, such as "beneath," below," upper," "lower," "above" and the like may be used herein for ease of description to describe one element or feature's relationship to another element(s) or feature(s) as illustrated in the drawings. These spatially relative terms are intended to encompass different orientations of the device in use or operation in addition to the orientation shown in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. For example, as used herein, the singular forms "a," "an" and "the" are intended to include the plural forms as well, unless the context clearly indicates otherwise. It will be further understood that the terms, "comprises" and/or "comprising," when used in this specification, specify the presence of stated features, integers, steps operations, elements, and/or components, but do not preclude the presence or addition of one or more other features, integers, steps, operations, elements, components, and/or groups thereof.

For a better understanding of the present invention, together with other and further objects, advantages and capabilities thereof, reference is made to the following disclosure and appended claims taken in conjunction with the above-described drawings.

Figure 2:
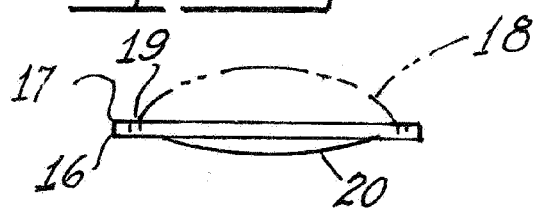
FIG. 2 is an elevation view of a PCE employable with the invention.

Referring now to the drawings with greater particularity, there is shown in FIGS. 1 and 2 a light source 10 comprising an array 11 of light emitting diodes 12 appropriately fixed to a suitable substrate 13. The light emitting diodes are each connected to an electrical power source (not shown) through at least wire 12a. A plurality of phosphor-containing-elements 14 (PCE or PCEs), only one of which is shown in FIG. 1 in the interest of clarity, is associated with the array 11 of light emitting diodes 12 in a one-to-one relationship, each of the PCEs 14 having a solid body 15 comprising a lateral portion 16 dividing a top 18 and a bottom 20, the bottom 20 being convex. The lateral portion 16 includes a periphery 17 preferably having at least one venting aperture 19 therein. Each PCE 14 is disposed above its respective light emitting diode 12 such that the light emitted by the light emitting diode is directed at the bottom 20 of PCE 14. The top 18 of the PCE 14 can be planar, convex or any other configuration and, if convex, have a degree of curvature, whereby it can provide a lens function, if desired. As an example, in FIGS. 3-5 the top 18 is shown as being hemispherical.

In a preferred embodiment of the invention, each of the light emitting diodes 12 emit a blue light in the range of 430-470 nm and the PCEs are solid, phosphor-filled, injection-molded silicone, polycarbonates, acrylics or similar material. Injection molding is preferred as this technique allows for very precise control of the PCE geometry. Because of the small size of the PCE, typically in the range of 1 mm to 20 mm on edge, a significantly smaller amount of phosphor will be utilized, generally in the range of 4-50 weight percent, although the actual amount will depend on the package on which it is mounted and the color point desired.

Figure 7:
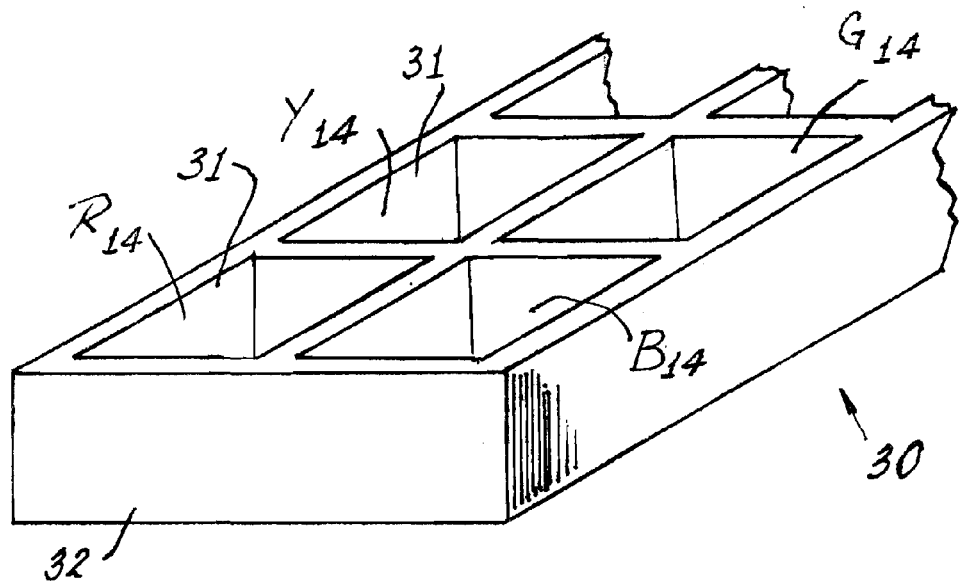
FIG. 7 is a diagrammatic, perspective view of an assembly of the invention.

When activated by the light emitted from said light emitting diodes 12, the PCEs 14 emit light having a different, and generally longer, wavelength than the light emitted by the light emitting diodes. This allows for the provision of a color modification assembly 30, as shown in FIG. 7, which comprises a plurality of PCEs 14 at least some of which contain phosphors selected from the group of red, yellow, blue and green emitting phosphors. A plurality of PCEs 14 which emit in different colors, for example, in the red, yellow, blue and green areas of the spectrum (and are represented diagrammatically in FIG. 7 as $R_{14}$, $Y_{14}$, $B_{14}$ and $G_{14}$ respectively), can be assigned to bins 31 in a compartmentalized container 32. Since the PCEs 14 are made independently of the LED package, the PCEs can be matched to a particular package to maximize the package wavelengths that can be used while minimizing the color variability between the packages.

Because the initial wavelength available from the LEDs is in the range of 430-470 nm, it is preferred that the phosphors selected for the assembly be excited to emission by wavelengths in that range.

Table I illustrates the approximate C.I.E. color coordinates of exemplary phosphors that can be employed with the invention, all of these phosphors being excited to luminescence by radiation in the 430-470 nm range, such as that available from an InGaN LED.

TABLE I

| PHOSPHOR | C.I.E. Color Coordinates (x, y) |
|---|---|
| $Y_3Al_5O_{12}:Ce^{3+}$ | (0.45, 0.52) |
| $Y_3Al_{5-x}Ga_xO_{12}:Ce^{3+}$ | (0.44, 0.53) |
| $(Lu,Y)_3(Al,Ga)_5O_{12}:Ce^{3+}$ | (0.42, 0.56) |
| $Ca_8Mg(SiO_4)_4Cl_2:Eu^{2+}$ | (0.20, 0.62) |
| $SrSi_2O_2N_2:Eu^{2+}$ | (0.36, 0.60) |
| $Ca_{1-x}Sr_xSi_2O_2N_2:Eu^{2+}$ | (0.38, 0.57) |
| $SrBaSi_2O_2N_2:Eu^{2+}$ | (0.45, 0.58) |
| $Ca_2Si_5N_8:Eu^{2+}$ | (0.58, 0.39) |
| $Ca_{5-d}Al_{4-2d}St_{8+2d}N_{18}Eu^{2+}$ | (0.59, 0.39) |
| $Sr_{2-x}Ca_xSi_5N_8:Eu^{2+}$ | (0.65, 0.32) |
| $Ba_{2-x}Sr_xSi_5N_8:Eu^{2+}$ | (0.59, 0.37) |

Figure 3:
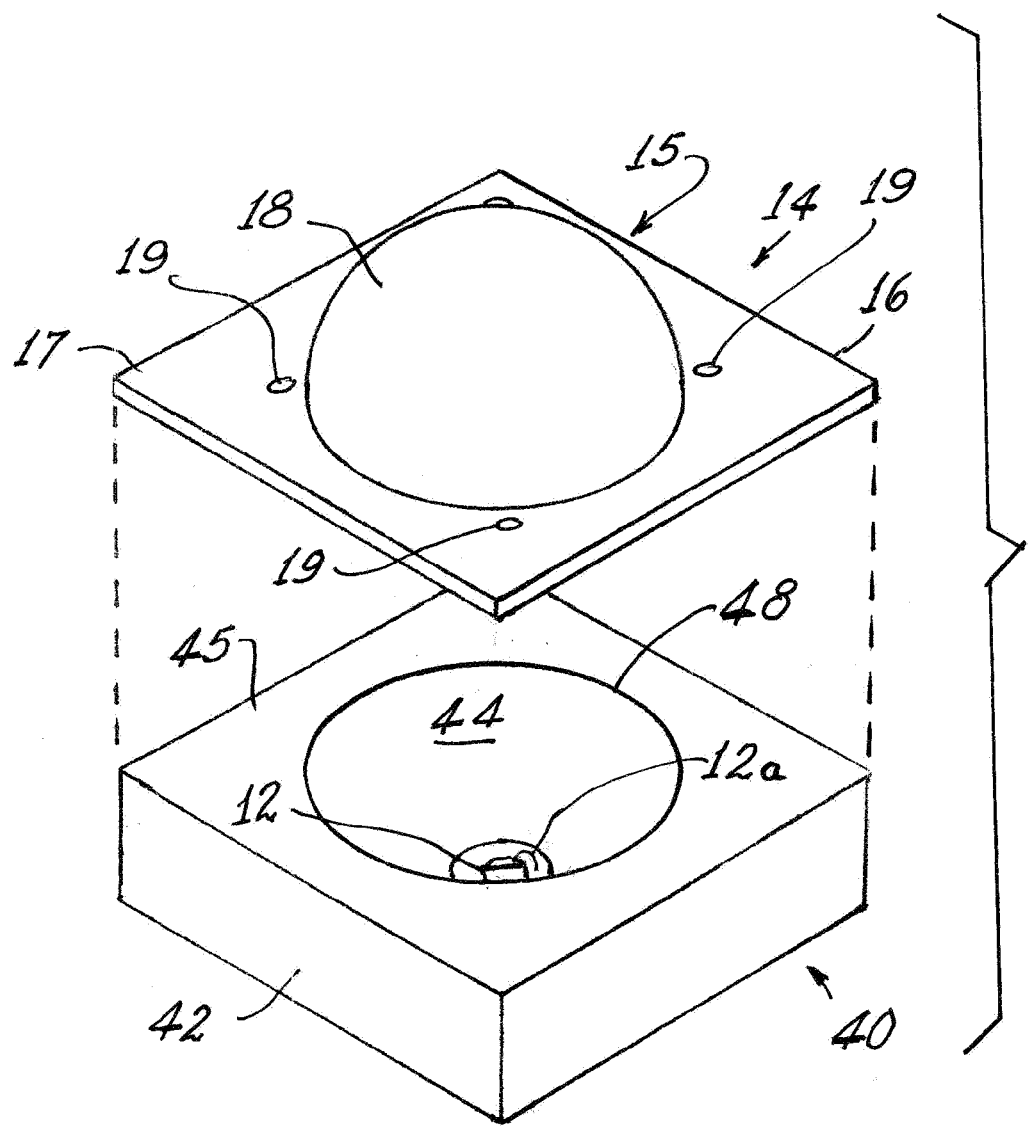
FIG. 3 is an exploded perspective view of an LED package with a PCE.
Figure 4:
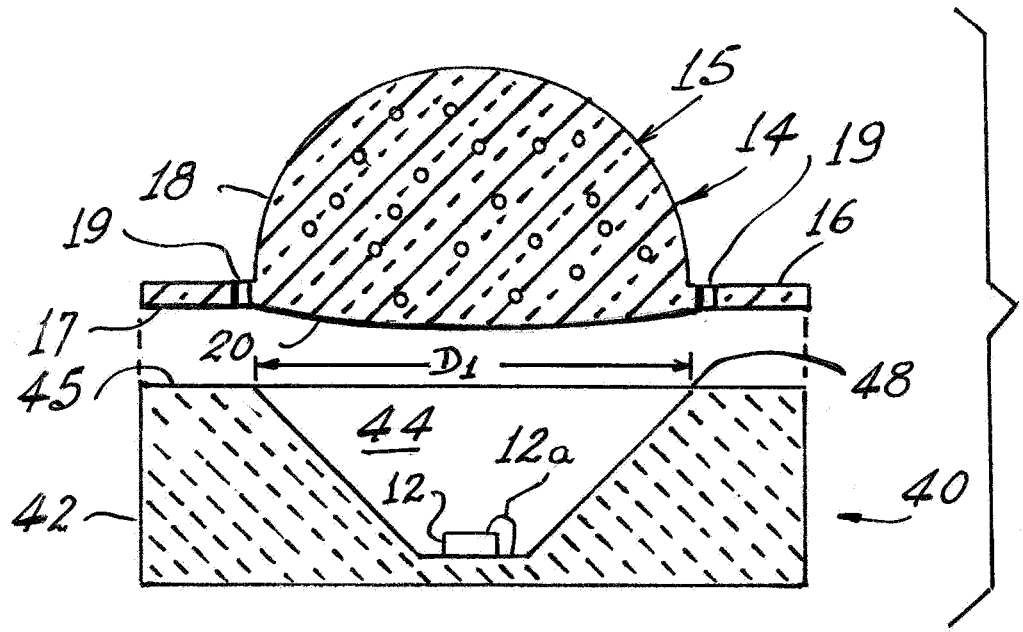
FIG. 4 is an exploded sectional view of an LED package before assembly.
Figure 5:
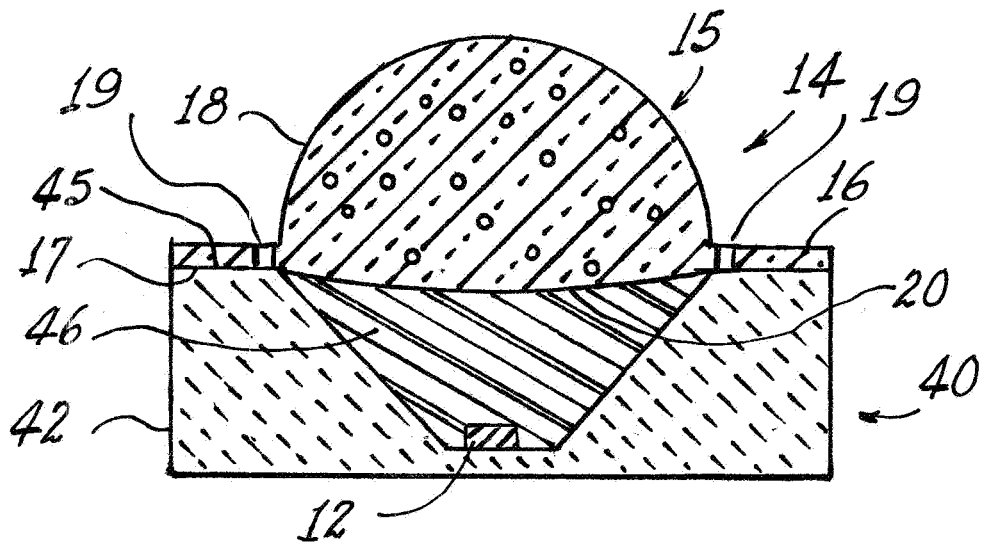
FIG. 5 is a similar view of the assembled unit.

A representative light-emitting diode package 40 is shown in FIGS. 3-5 and comprises a body 42 with a hollow 44 having a rim 45 extending outwardly from open end 48. The open end 48 has a diameter $D_1$. A light emitting diode 12 is positioned in the hollow 44 and a nongaseous transparent optical medium 46, such as silicone, epoxy or other optical adhesive, fills the hollow 44. A PCE 14 seals the hollow 44 with the periphery 17 of the PCE 14 in contact with the rim 45 and completes the package 40. The convex bottom 20 of the PCE displaces some of the nongaseous transparent optical medium 46 and insures that no air bubbles exist at the interface. It is also advisable to place a vent or vents 19 about the periphery 17 of the lateral portion 16 to further aid in the removal of any air bubbles. The vents can take the form of apertures 19 as shown in FIGS. 3-5 or grooves 19a as shown in the embodiment described below.

Figure 6A:
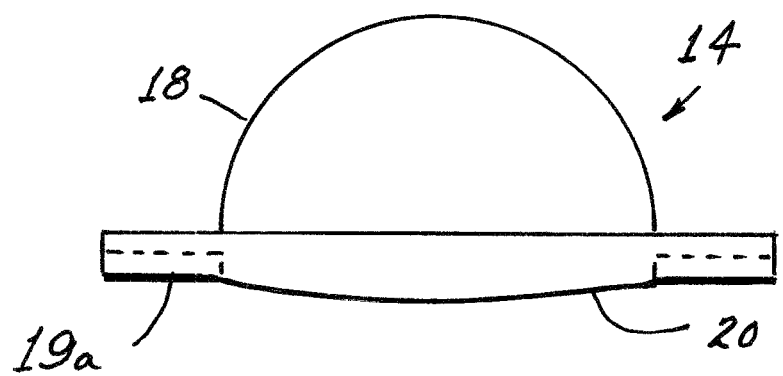
FIG. 6A is an elevation view of an alternate embodiment of the invention.
Figure 6B:
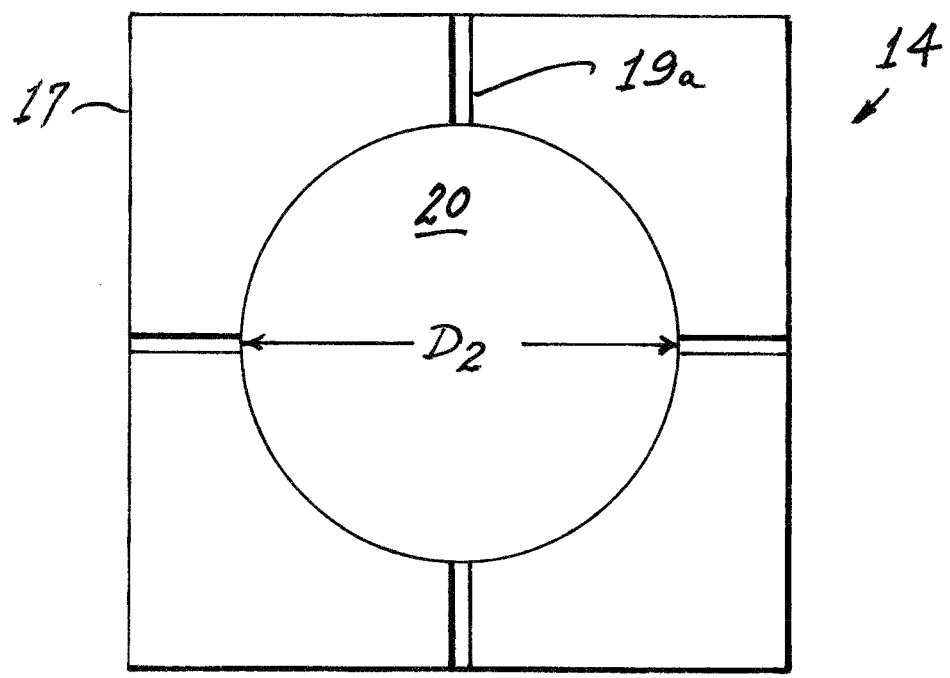
FIG. 6B is a plan view of the bottom of the embodiment of FIG. 6A.

In an alternate embodiment, shown in FIGS. 6A and 6B, the PCE 14 can be provided with longitudinal grooves 19a in place of or in addition to the apertures 19. As with previous embodiments the convex bottom 20 has a diameter $D_2$ wherein $D_2$ preferably is approximately equal to $D_1$ so that any air that might be otherwise trapped underneath the PCE 14 is shunted to the grooves. Moreover, the grooves allow for any excess of the transparent medium 46 displaced by the convex bottom 20 to flow into the grooves to relieve any pressure when seating the PCE 14 to the package 40 and also provide for additional bonding between the periphery and the rim.

Figure 8:
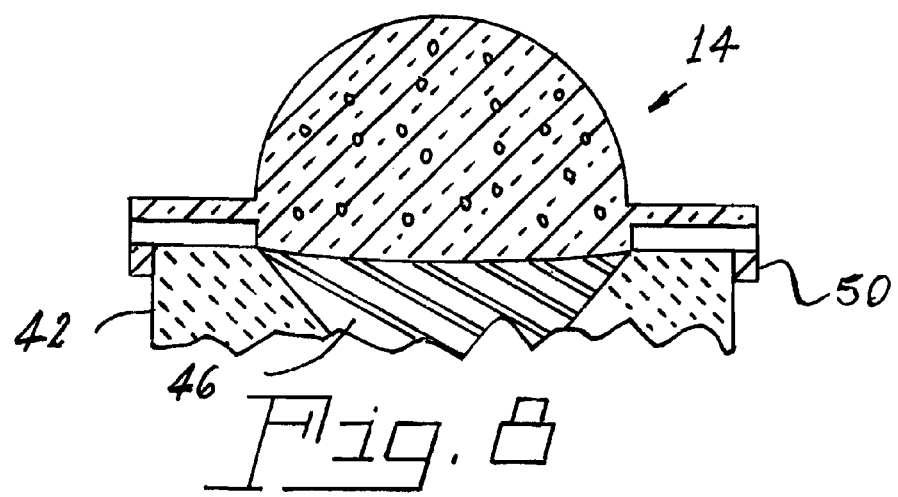
FIG. 8 is a sectional, elevation view of yet another embodiment.

In yet another embodiment, shown in FIG. 8, the lateral portion 16 of the solid body 15 can terminate in a curb or lip 50 that fits about the external edge of the body 42 to aid in alignment of the PCE 14 to the body 42 of package 40.

The PCEs can be provided on an individual basis or with an assembly that allows considerable range of color matching or correcting. The peripheral rim of the lateral portion, together with the convex bottom and the venting apertures assures a good bond with no distorting air bubbles in the transparent optical medium or the interface between the medium and convex bottom.

While there have been shown and described what are at present considered to be the preferred embodiments of the invention, it will be apparent to those skilled in the art that various changes and modifications can be made herein without departing from the scope of the invention as defined by the appended claims.

GLOSSARY OF REFERENCE NUMERALS USED HEREIN 10 light source
11 array of diodes
12 diodes
12a wire
13 substrate
14 phosphor containing elements (PCEs)
15 solid body of PCEs
16 lateral portion of 15
17 periphery of 16
18 top of 16
19 venting aperture in 17
19a venting groove in 17
20 bottom of 16
30 assembly
31 bins
32 container
40 light-emitting diode package
42 body of 40
44 hollow in 42
46 nongaseous transparent optical medium
48 open end
50 curb on 16
$D_1$ diameter of 48
$D_2$ diameter of 20

What is claimed is:

1. A light-emitting diode package comprising:
a body including a hollow having a rim, said rim extending outwardly from an open end of said hollow;
a light emitting diode positioned in said hollow and opposite said open end;
a nongaseous transparent optical medium filling said hollow; and
a phosphor-containing element (PCE) disposed over said hollow and sealing said open end, said PCE having a solid body and a lateral portion including a periphery dividing a top and a bottom, said bottom being convex and in contact with said nongaseous transparent optical medium and said periphery being in contact with said rim and including at least one venting aperture.

2. The light-emitting diode package of claim 1 wherein said top is convex.

3. The light-emitting diode package of claim 2 wherein said top has a greater convexity than said bottom.

4. The light-emitting diode package of claim 1 wherein said light emitting diode emits in the range of 430-470 nm.

5. The light-emitting diode package of claim 1 wherein said PCE contains at least one phosphor selected from the group of red-, yellow-, blue- and green-emitting phosphors.

6. The light-emitting diode package of claim 1 wherein said open end has a diameter $D_1$ and said convex bottom has a diameter $D_2$ which is approximately equal to $D_1$.

7. The light-emitting diode package of claim 1 wherein said periphery includes at least one longitudinal groove.

8. The light-emitting diode package of claim 1 wherein said lateral portion of said solid body terminates in a curb.

9. A light source comprising:
an array of light emitting diodes;
each light emitting diode being positioned in a hollow having an outwardly extending rim;
a plurality of phosphor-containing elements (PCE), each PCE disposed above a respective light emitting diode;
a nongaseous transparent optical medium disposed between each PCE and its respective light emitting diode;
said PCEs comprising:
a solid body having a lateral portion dividing a top and a bottom, said bottom being convex, said lateral portion having a periphery, said bottom being in contact with said nongaseous transparent optical medium and said periphery being in contact with said rim; and
wherein said light emitting diodes are disposed in bins in a compartmentalized container.

10. The light source of claim 9 wherein said hollow has an open end having a diameter $D_1$ and said convex bottom has a diameter $D_2$ which is approximately equal to $D_1$.

11. The light source of claim 9 wherein said periphery includes at least one venting aperture.

12. The light source of claim 11 wherein said venting aperture is a longitudinal groove.

* * * * *